United States Patent [19]

Johnson

[11] Patent Number: 5,069,629
[45] Date of Patent: Dec. 3, 1991

[54] ELECTRICAL INTERCONNECT CONTACT SYSTEM

[76] Inventor: David A. Johnson, 5600 W. 25½ St., St. Louis Park, Minn. 55416

[21] Appl. No.: 639,126

[22] Filed: Jan. 9, 1991

[51] Int. Cl.⁵ .............................................. H01R 9/09
[52] U.S. Cl. ..................................... 439/71; 439/66; 439/591
[58] Field of Search ....................... 439/66, 69, 71, 72, 439/76, 91, 247, 248, 591

[56] References Cited

U.S. PATENT DOCUMENTS

| | | | |
|---|---|---|---|
| 3,551,750 | 12/1970 | Sterling | 439/66 |
| 4,445,735 | 5/1984 | Bonnefoy | 439/66 |
| 4,593,961 | 6/1986 | Cosmo | 439/591 |
| 4,634,199 | 1/1987 | Anhalt et al. | 439/69 |
| 4,793,814 | 12/1988 | Zifcak et al. | 439/66 |

*Primary Examiner*—Paula A. Bradley
*Attorney, Agent, or Firm*—Lawrence M. Nawrocki

[57] ABSTRACT

An electrical interconnect assembly for interconnecting a lead of an integrated circuit device to a terminal spaced at a distance from a corresponding lead of the integrated circuit. The assembly includes a housing which is, typically, positioned between the lead of the integrated circuit and the corresponding terminal. The housing includes at least one slot which extends through the thickness thereof. Each of first and second opposed surfaces of the housing has formed therein a trough which is positioned at a location proximate the integrated circuit lead and the spaced terminal corresponding to the integrated circuit lead, respectively. A rigid first element is received in the trough formed in the first surface, and the rigid element extends across any slots in which one or more contacts are received. A generally planar contact is received within each of the one or more of the slots. Each contact has a protrusion extending outward from the first surface of the housing to be engaged by an integrated circuit lead, and, similarly, each contact has a nub normally extending outward from the housing toward the second surface of the housing to engage a corresponding spaced terminal. Each contact has a hook portion proximate the nub of the contact. The hook portion encircles an elastomeric second element received in the trough formed in the second surface of the housing. Each contact has an elongated channel to receive the rigid first element formed therein, the channel receiving the rigid first element for relative movement along the channel.

6 Claims, 4 Drawing Sheets

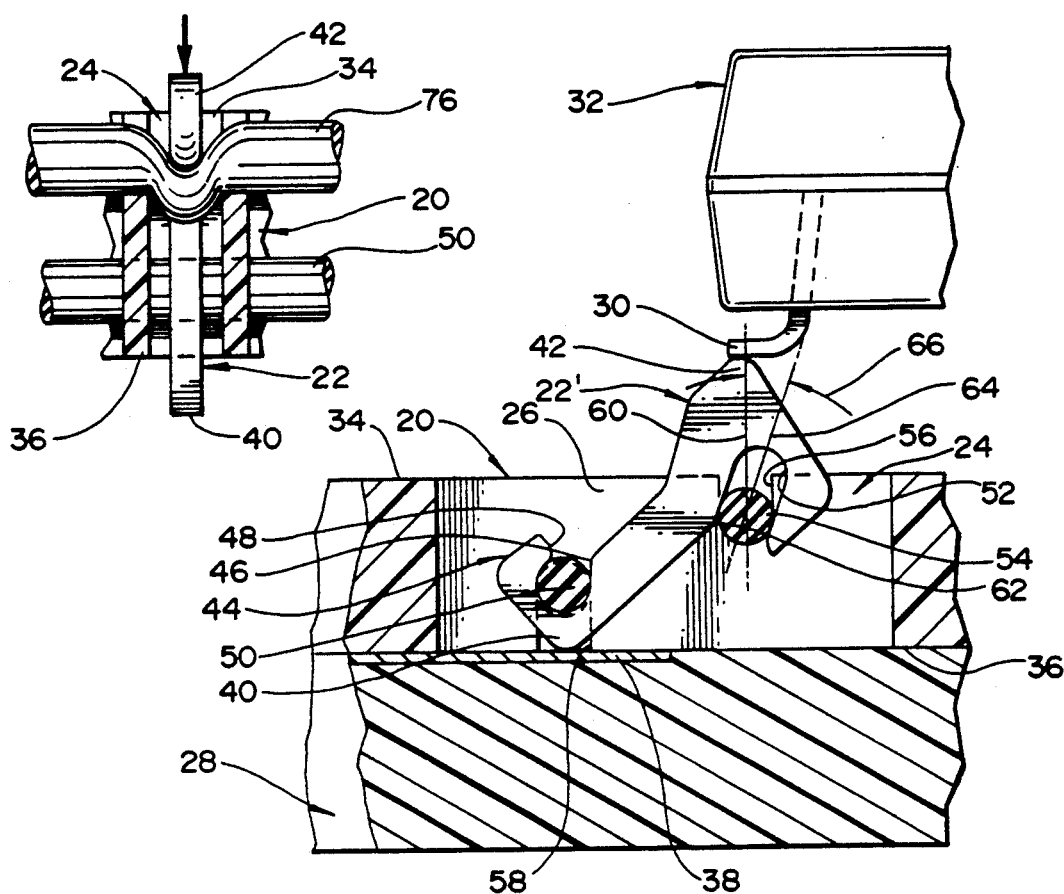

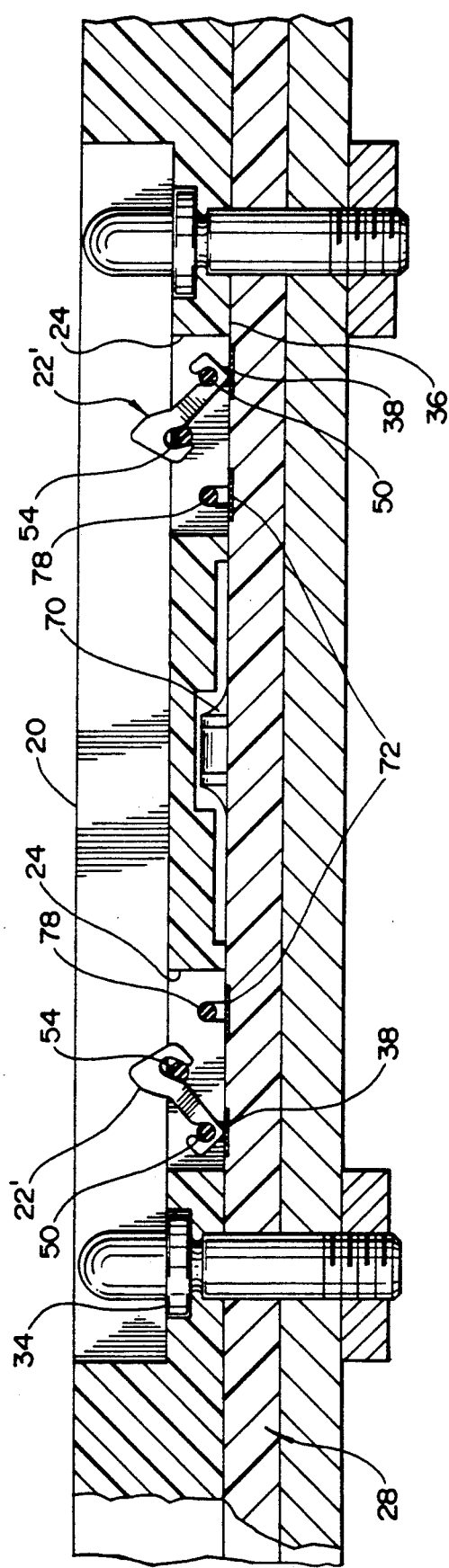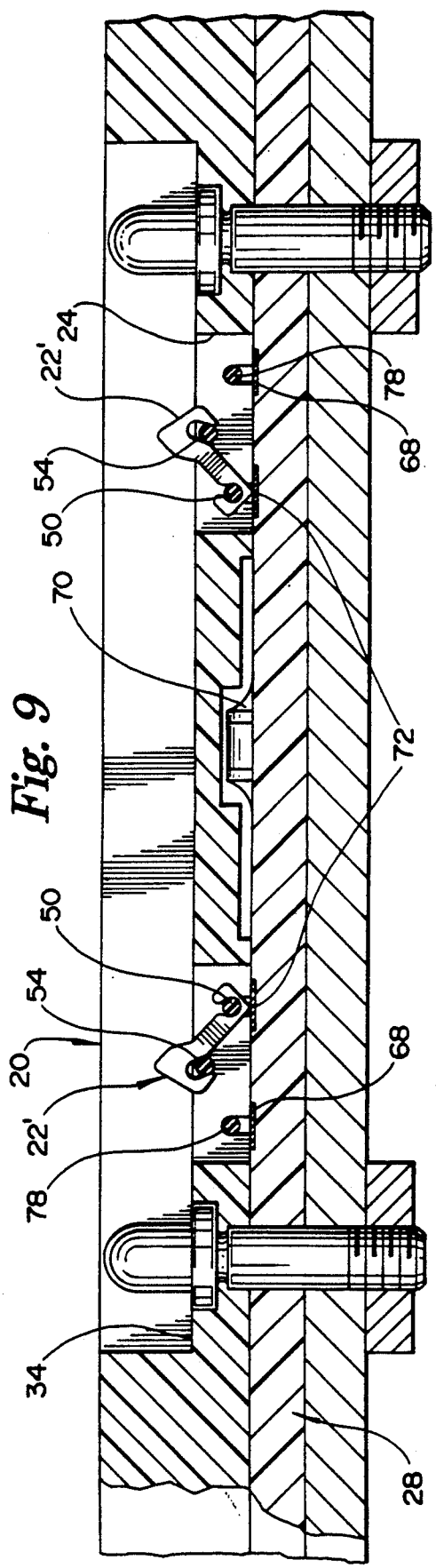

ELECTRICAL INTERCONNECT CONTACT SYSTEM

TECHNICAL FIELD

The present invention deals broadly with the field of electrical interconnect systems. More narrowly, however, the invention is related to technology, for example, for interconnecting the leads of an integrated circuit device with corresponding terminals on a printed circuit board interfacing with a tester intended to effect test analysis of the integrated circuit device. The preferred embodiment of the invention is directed to contacts and means for mounting the contacts for effecting such interconnection.

BACKGROUND OF THE INVENTION

A plethora of applications exist for effecting electrical contact between two conductors. One significant application is effecting interconnection between the leads of an integrated circuit device and conductive pads or terminals on a printed circuit board which serves to effect an interfacing between the integrated circuit device and a tester apparatus. Such apparatus serve to evaluate performance of integrated circuit devices.

Numerous considerations bear upon the structure employed to interconnect the IC and the printed circuit board. These factors both include electrical and mechanical considerations. One prior art structure which seeks to accomplish the purpose of the present invention is known as the Yamaichi contact. This type of contact includes an inverted L-shaped support having a cantilevered contacting portion mounted at the distal end of the generally horizontal leg of the inverted, L-shaped support, and extending generally parallel to that leg. The distal end of the contacting portion is upwardly turned so that a point thereof is engageable by a lead of an integrated circuit device to be contacted. The support, in turn, is engaged in some manner with or through a pad or terminal portion of a printed circuit board.

One of the mechanical considerations to be taken into account in designing an interconnect system is that a wiping action should be accomplished between the contact itself and the lead of the IC by which the contact is engaged. The wiping action functions to effect maximization of effective contact in view of oxide build-up which can occur. In effect, the wiping action enables a good interface to be accomplished between the contact and the lead of the IC.

In view of the fact that the cantilevered portion of the Yamaichi contact has some measure of flexibility, a wiping action can be accomplished. Another mechanical consideration that must be taken into account, however, is the desire to deter bending of a lead on the IC. The Yamaichi contact does not fully accomplish this goal.

Finally with respect to mechanical considerations, it is desirable that wiping action can be accomplished at the interface between the second end of the contact and the printed circuit board. In view of the construction of the Yamaichi contact, it is precluded from allowing such wiping action at the lower end of the contact.

Further, the Yamichi device does not sufficiently consider the electrical dictates for an interconnecting contact system. An interconnecting contact should be a high speed, short path device. Derivatively, such a contact should have a low inductance without having a controlled impedance requirement. Because of the construction of the Yamaichi contact, it does not adequately satisfy these requirements.

U.S. Pat. No. 4,445,735 which issued on May 1, 1984 illustrates another type of electrical connection device. The device of that patent serves to establish an electrical connection between contacts of a circuit network on a substrate and contact pads of a conductor network on a printed circuit board. This device is an improvement over the Yamaichi contact in that it is higher in speed and lower in inductance than the Yamaichi device. It has elastomeric means for mounting one or more contacts in a housing. The elastomeric biasing and mounting enables wiping action to be effected at both upper and lower ends of the contact. That is, both the end which engages an IC lead and the end which engages a printed circuit board contact pad can be wiped across the surfaces intended to be contacted.

The device of the '735 patent, however, retains some limitations. While some wiping action is afforded at both upper and lower ends of the contact, the amount of such wiping action is relative limited because of the elastomeric elements being used generally for effecting biasing rather than free floating suspension of the contacts. As a result of the mounting means incorporated in the '735 patent, there will be a primary tendency for some retraction of the contact point in a generally vertical direction, but there will be only a small component of lateral movement to effect wiping. Additionally, because of the lack of any significant free floating effect, lead bending on an integrated circuit being tested can occur.

It is to these dictates and shortcomings of the prior art that the present invention is directed. It is an improved electrical interconnecting system which addresses the dictates of the prior art and resolves problems thereof.

SUMMARY OF THE INVENTION

The present invention is an assembly which functions to electrically interconnect a lead of an integrated circuit device to a terminal, for example, of a printed circuit board, spaced at a distance from the corresponding lead of the integrated circuit. The assembly includes a housing which is interposed between the lead of the integrated circuit and the corresponding spaced terminal. The housing s provided with at least one slot, extending therethrough from a first surface to an oppositely facing second surface. The one or more slots extend substantially parallel to an axis along which corresponding integrated circuit lead and spaced terminal are aligned. The first surface of the housing has, formed therein, a trough proximate the location of the integrated circuit lead, and the second surface of the housing has, formed therein, a similar trough, the trough in the second surface being disposed proximate the spaced terminal corresponding to an integrated circuit lead. A rigid first element is received in the trough formed in the first surface and extends across any slots in which one or more contacts are received. An elastomeric second element is received in the trough formed in the second surface of the housing and extends across the one or more slots in which contacts are received. The elastomeric second element is provided with a measure of compressibility and tensile extendability. A generally planar contact is received within one or more of the slots, each contact having a protrusion extending outward from the first surface of the housing to be engaged by an integrated circuit lead. Each contact also has a nub normally extending outward from the housing toward the second surface of the housing to engage a corresponding spaced terminal. Further, each contact has a hook portion proximate the nub of the contact, the hook portion encircling the elastomeric second element to hold the contact to the elastomeric second element. Each contact has formed therein an elongated channel to receive the rigid first element therein for relative movement of that element along the channel. Relative movement results as the protrusion of the contact is engaged by, and urged inwardly into the housing by, an integrated circuit lead. The assembly functions, as a result of the rigid first element moving relatively along the channel formed in the contact, wherein the protrusion of the contact moves across the integrated circuit lead by which it has been engaged, and the nub of the contact moves across the corresponding spaced terminal of the printed circuit board.

In one embodiment of the invention wherein the trough formed in the first surface of the housing is substantially symmetrical with respect to a plane normal to the first surface, an axis of elongation of the channel formed in each of the contacts is at an angle relative to such a plane. Typically in this embodiment, the trough formed in the second surface of the housing is laterally offset from that formed in the first surface. As a particular lead of an integrated circuit device engages the protrusion of a corresponding contact and exerts downward pressure upon the protrusion, the channel in the contact will move relatively to the rigid first element received therein, and the contact will, effectively, be made to rotate to some extent as a result of the rigid first element moving, relative to the contact, more deeply into the channel formed in the contact. The downward force exerted by the lead of the integrated circuit upon the contact will have components along both X and Y axes, and these components will effect the apparent rotation of the contact. As a result, the protrusion will move laterally to some degree across the surface of the integrated circuit lead by which it is engaged, and the nub of the contact will move laterally across the integrated circuit board terminal with which it is in contact.

In another embodiment of the invention, a plurality of slots, each receiving a contact, are provided. Typically, a multiplicity of contacts are employed, one for each integrated circuit lead. In such an embodiment, the printed circuit board is provided with a plurality of terminals, each being in engagement with one of the ganged contacts.

In such a multiple contact embodiment, an additional elastomeric second element can be provided. The additional elastomeric second element being disposed in a second trough formed in the second surface of the housing and being symmetrical, with respect to the initial elastomeric second element, relative to the rigid first element. Contacts in immediately adjacent slots can be staggered (that is, alternately hooked to the initial elastomeric second element and the additional elastomeric second element). By providing such a structure twice the contacting density per unit length can be provided.

In this embodiment, a trough need not be provided to receive the rigid element. Since there are at least two oppositely-acting, cooperating contacts, the rigid element will be maintained within the channels of the contacts. Since the channels are angled in opposite directions, they will act as jaws to hold the rigid element in place.

Another embodiment employs an elastomeric elongated element in the trough formed in the first surface of the housing rather than a rigid element. This embodiment would employ a hook member proximate the protrusion of the contact at the upper end thereof rather than an elongated channel as in the first-described embodiment. The contact would, therefore, latch onto the upper elastomeric element as it does onto the lower elastomeric element. In this embodiment, the contact is more free-floating than in the previously described embodiment.

The present invention is thus an electrical contact interconnecting system improved over systems of the prior art. More specific features and advantages obtained in view of those features will become apparent with reference to the DETAILED DESCRIPTION OF THE INVENTION, appended claims, and accompanying drawing figures.

BRIEF DISCLOSURE OF THE DRAWINGS

FIG. 5 is a view similar to FIG. 3 showing the contact being manipulated in order to effect connection or disconnection to the rigid and elastomeric members;

FIG. 6 is a fragmentary side elevational view of another embodiment of the invention with some parts cut away;

FIG. 7 is an enlarged view similar to FIG. 6 showing articulation of a contact in dashed lines;

FIG. 8 is a fragmentary side elevational view with some parts cut away showing an embodiment of the invention in signal mode contact configuration;

FIG. 9 is a view similar to FIG. 8 showing the embodiment in a decoupling mode contact configuration;

DETAILED DESCRIPTION OF THE INVENTION

Figure 1:
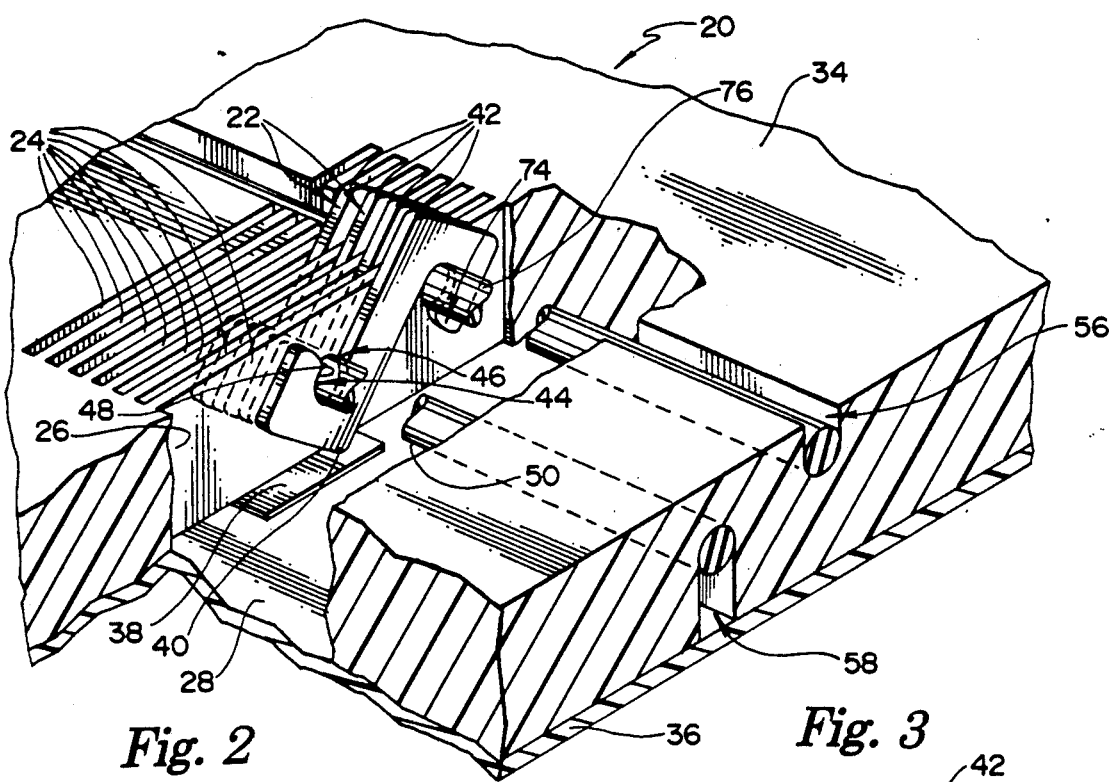
FIG. 1 is an enlarged fragmentary perspective view of one embodiment of the present invention illustrating plural contacts.

Referring now to the drawings wherein like reference numerals denote like elements throughout the several views, FIG. 1 illustrates a housing 20 suspending a plurality of contacts 22 in accordance with the present invention. The housing 20 shown in FIG. 1 is representative of a housing usable in virtually all embodiments of the invention, although, in some embodiments, some variations, generally unrelated to contact mounting, could be incorporated.

Some portions of the housing 20 are broken away in FIG. 1, but one viewing the figure can count at least seven slots 24 formed through the housing 20. The rightmost of the slots 24 is sectioned so that only one side wall 26 of the slot 24 is able to be seen.

While seven slots 24 are illustrated, only four contacts 22 are shown as being disposed in slots 24. It will be understood, however, that, typically, a contact 22 would be suspended within the housing 20 in each slot 24 provided, although this would not be essential. Additionally, it will be understood that any number of slots 24 could be provided, and the slots 24 could be organized in multiple arrays. For example, four arrays of slots 24 defining a quadrilateral form could be employed. Such a configuration would be employed when the housing 20 in accordance with the present invention is intended to interconnect a printed circuit board 28, interfacing with a tester mechanism (not shown), to the leads 30 of, for example, a leadless chip carrier integrated circuit device 32. FIG. 1, therefore, is merely illustrative of a rudimentary housing 20 in accordance with the invention.

As seen in FIG. 1, the rightmost slot 24 is shown as extending fully through the vertical dimension of the housing 20 from a first, upwardly facing surface 34 of the housing 20, to a second downwardly facing surface 36 of the housing 20. The same is true of each slot 24.

The second surface 36 of the housing 20 is shown as being in engagement with a printed circuit board 28 having at least one pad or terminal 38 traced thereon. Such a pad 38 is intended to be engaged by a nub 40 at the lower end of the contact 22 as will be discussed hereinafter. In view of the fact that the nub 40 is biased to extend outwardly at least to the second surface 36 of the housing 20, when the printed circuit board 28 is held in position in engagement with the second surface 36 of the housing 20, the nub 40 of the contact will, in fact, engage the pad 38 if the pad 38 is properly positioned spatially.

FIGS. 6 and 7, to which further reference will be made in describing the embodiment thereof, show a contact 22' suspended in a housing 20 in a manner discussed hereinafter. The contact 22' has a small measure of elongation and has a protrusion 42 at its upper end, the protrusion 42 functioning to be engaged by a lead 30 from an integrated circuit device 32 intended to be interconnected to the printed circuit board 28. As seen in FIGS. 6 and 7, when the contact 22' is suspended by the housing 20, the protrusion 42 extends upwardly beyond the first surface 34 of the housing 20.

As previously discussed, the contact 22' has, at its lower end, a nub 40. The nub 40 is, of course, intended to engage the terminal or pad 38 on the printed circuit board 28 which corresponds to a particular integrated circuit lead 30 engaged by the protrusion 42 of the respective contact 22'.

Proximate the nub 40 is a hook portion 44 of the contact 22'. The hook portion 44 defines a generally circular aperture 46 which is pinched at the entry thereto, as at 48, so that, when the hook portion 44 is urged over an elastomeric element 50 as defined hereinafter, the contact 22' will be maintained in a position suspended with respect to the elastomeric element 50.

The contact 22', proximate its upper protrusion end, is provided with an elongated channel 52. This channel 52 is intended to receive a rigid element 54 as defined hereinafter.

Referring now again to FIG. 1 which illustrates a representative housing 20, the first surface 34 of the housing 20 is provided with a trough 56, that trough 56 extending across, and generally transverse to, the plurality of slots 24. In a like manner, the second surface 36 of the housing 20 also has a trough 58 formed therein. This trough 58 also extends across the various slots 24 and is illustrated as being generally transverse to the direction of orientation of the slots 24. Each trough 56, 58 is shown as being generally symmetrical with respect to an imaginary plane 60 that would be perpendicular to the respective surface in which the trough 56, 58 is formed. It will also be noted that the troughs 56, 58 are laterally offset from one another for a purpose that will become apparent in view of subsequent discussion.

The trough 56 formed in the first surface 34 is intended to accept the rigid element 54 in the case of the embodiment of FIGS. 6 and 7. The element 54 is shown as extending fully across the array of slots 24 across which the trough 56 in which the element 54 is received extends.

In that embodiment, the trough 58 formed in the second surface 36 of the housing 20 is intended to accept a compressible, tensiley extendable, elastomeric element 50 therein. In the case of the rigid element 54 received in the trough 56 formed in the first surface 34 of the housing 20, the elastomeric element 50 received in the trough 58 formed in the second surface 36 of the housing 20 is intended to extend fully across the array of slots 24 across which the trough 58 in which the elastomeric element 50 is received extends.

Mounting, or suspension, of individual contacts 22' in the embodiment of FIGS. 6 and 7 can be effected in any appropriate manner. One simple manual way of effecting suspension would be to insert the contact 22' downwardly through the slot 24 within which it is to be received by urging the nub 40 end between the rigid element 54 and the elastomeric element 50, those two members having been received within their respective troughs 56, 58. Once the hook portion 44 has been inserted to a point at which it has achieved a location below the elastomeric element 50, the hook portion 44 can be moved laterally to "catch" the elastomeric element 50 therewithin. After such "catching" has occurred, the contact 22' would be withdrawn upwardly to a point at which the entrance to the elongated channel 52 in the contact 22' is above the upper edge of the rigid element 54. The protrusion end of the contact 22' can then be moved in a direction to the right, as viewed in FIGS. 6 and 7, until the entrance 62 to the channel 52 is above the rigid element 54. It will be understood that, as the contact 22' is withdrawn upwardly, the elastomeric element 50 will come under tension when the contact 22' is in a disposition wherein the entrance 62 to the channel 52 is above the rigid element 54. When the contact 22' is in such a disposition, the contact 22' can be eased downwardly so that the rigid element 54 enters the channel 52. The tension on the elastomeric element 50 will, thereby, be released, and the contact 22' will be in its "rest" position. This procedure can be performed for multiple contacts 22' when a gang or array of contacts 22' is employed.

The "rest" position of a contact 22' is represented in solid line in FIG. 7. The center-line axis 64 of the channel 52 is angled slightly to the right of a plane of symmetry 60 of the trough 56 within which the rigid element 54 is received. That plane of symmetry 60 is generally normal to the first surface 34 of the housing 20 and is represented by a dashed line. The center-line axis 64 of the channel 52 formed in the contact 22' is represented by an additional line 64 in FIG. 7 at a slight angle with respect to the line representing the plane of symmetry 60 of the trough 56. An angle representation 66 indicates the angle at which the channel 52 is tilted from the plane of symmetry 60 of the trough 56. This angle 66 can be, in the "rest" position of the contact 22', quite small and probably, it is anticipated, of a magnitude of between about 3° and 30°.

FIG. 7 also illustrates the movement of a contact 22' as the protrusion 42 of the contact 22' is engaged by a lead 30 of an integrated circuit device 32. As the integrated circuit device 32 is brought into engagement with the protrusion engagement point and downward pressure continues, the rigid element 54 rides upwardly, relative to the elongated channel 52 in the contact 22', and the angle of offset 66 of the axis 64 of the channel 52 becomes more exaggerated. As this occurs, the engagement point of the protrusion 42 is moved downwardly and to the right. The rightward movement of the engagement point of the protrusion 42 will permit relative movement of the engagement point across the surface of the integrated circuit lead 30. This wiping action will provide for a better electrical flow path between the integrated circuit lead 30 and the protrusion 42 of the contact 22'.

One of the reasons why the apparent rotation of the contact 22' will occur is that the nub end of the contact 22' will be precluded from downward movement by the terminal or pad 38 of the printed circuit board 28. As previously discussed, in the embodiment illustrated in FIGS. 6 and 7, the printed circuit board 28 is substantially in engagement with the second surface 36 of the housing 22'. The vertical location of the deepest part of the trough 58 formed in the second surface 36 of the housing 20 relative to the dimensions of the lower portion of the contact 22' will provide for biasing of the nub 40 of the contact 22' into engagement with the printed circuit board pad 38. As the integrated circuit 32 urges the protrusion 42 of the contact 22' downwardly, therefore, the nub 40 will be driven in a direction to the left as viewed in FIG. 7. Wiping action will, thereby, occur, and the electrical flow path between the nub 40 of the contact 22' and the printed circuit board terminal 38 will be optimized.

FIGS. 8 and 9 show contacts and contact suspension means as illustrated in FIGS. 6 and 7 to illustrate signal and decoupling modes of the housing 20. FIG. 8 illustrates the invention embodiment in a signal mode configuration. This view shows the contacts 22' configured to interface signal terminals or lands 68 on the printed circuit board 28.

FIG. 9 illustrates a decoupling mode. In the decoupling mode, the integrated circuit device 32 has multiple ground and, sometimes, multiple power leads which need to be connected by a capacitor 70 to allow current response when outputs of the integrated circuit device 32 are switched. In the prior art, the customer is assisted in meeting needs for specific device configurations of ground and power locations. These locations are virtually always located near the center of the sides, since the internal lead inductance is the smallest. The housing 20 is designed to permit center contacts to be mirrored to allow ground and power leads to directly contact one of multiple decoupling planes 72. Each decoupling plane 72 used is designated as either a ground or power plane so that, when a chip capacitor 70 is soldered across these planes 72, a decoupling circuit will be formed.

Both the signal terminals or lands 68 and the decoupling planes 72 are connected to external customer circuits. The contacts 22' are shown as mirrored to allow for direct integrated circuit electrical connection to the decoupling planes 72. The decoupling planes 72 are decoupled by a chip capacitor 70.

Figure 2:
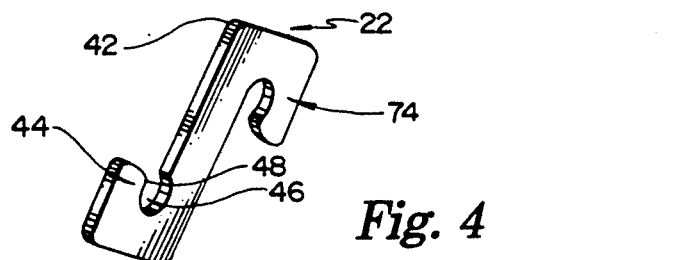
FIG. 2 is a perspective view of an individual contact of the embodiment of FIG. 1.

The contacts 22 illustrated in FIGS. 1-5 are different than those illustrated in FIGS. 6-7. FIG. 2 illustrates an alternative form contact 22 isolated from a slot 24 within the housing 20. The primary difference between this contact 22 and that previously described is that the contact 22 does not have an elongated channel 52 proximate the upper protrusion portion. Rather, the contact 22 of FIGS. 1-5 is provided with a hook portion 74 similar to the hook portion 44 proximate the nub 40 of the contact embodiment previously described.

When the contact 22 illustrated in FIGS. 1-5 is employed, a different type of element 76 would be seated in the trough 56 formed in the first, or upper, surface 34 of the housing 20. Rather than providing a rigid element 54, the element 76 which would be received in the trough 56 in the first surface 34 of the housing 20 in this embodiment would be elastomeric in nature and similar to the element 50 in the trough 58 formed in the second surface 36 of the housing 20. Both elements would, therefore, have a measure of compressibility and tensile extendability rather than only one element having such compressibility and tensile extendability, as is the case with the embodiment of FIGS. 6 and 7.

With both elements being elastomeric in nature, movement of both the protrusion 42 and nub 40 of the contact 22 would still be able to occur along two mutually-perpendicular axes. That is, both the protrusion 42 and the nub 40 of the contact 22 could move generally horizontally and vertically in view of the compressibility of the two elements. The embodiment of FIGS. 1-5, therefore, would also achieve the desired wiping action. At the same time, integrated circuit lead damage would be minimized, since the contact 22 is substantially free-floating in its suspension within the housing 20.

It will be understood that the response of the system can be controlled by varying the durometer rating of the element 76 received within the trough 56 formed within the upper surface 34 of the housing 20. The harder that the element 76 is, the more resistant it will be to lateral motion of the contact protrusion 42, and wiping action of protrusion 42 across the lead 30 of an integrated circuit 32 will be reduced. A typical durometer range is between 30 and 90 Shore D.

Figure 3:
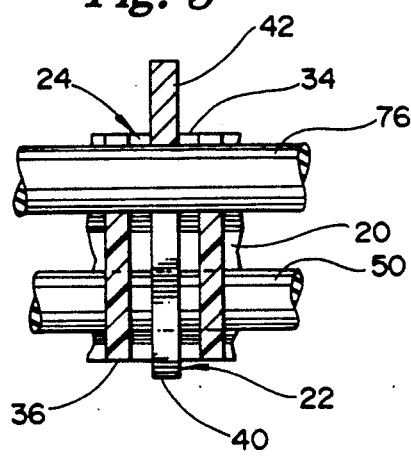
FIG. 3 is a fragmentary functional diagram showing the embodiment of the invention of FIG. 1 sectioned vertically and at rest.

FIG. 3 illustrates the contact 22 of the embodiment of FIGS. 1-5 in its normal "rest" position. In this position, both elastomeric elements 50, 76 extend substantially linearly.

FIG. 5 illustrates the manner in which the elastomeric elements 50, 76 could be manipulated in order to effect mounting. FIG. 5 shows a contact 22 having been inserted upwardly through the bottom, second surface 36 of the housing 20 so that the protrusion 42 of the contact 22 passes between the two elastomeric elements 50, 76 and the hook portion 74 proximate the protrusion 42 of the contact 22 is positioned above the elastomeric element 76 received within the trough 56 formed within the first surface 34 of the housing 20. The upper hook portion 74 then is brought downwardly to "catch" the elastomeric element 76 received in the trough 56 formed in the first surface 34 of the housing 20. FIG. 5 illustrates the contact 22 with such attachment to the elastomeric element 76 received in the trough 56 formed in the first surface 34 of the housing 20 being drawn downwardly to deform that element 76 so that the lower hook portion 44 can be brought into a disposition at which it can "catch" the elastomeric element 50 received in the trough 58 formed in the second surface 36 of the housing 20. When the lower hook portion 44 is brought into such a position, the contact 22 can be gradually released to effect catching of the elastomeric element 50 received in the trough 58 formed in the second surface 36 of the housing 20. After his occurs, the contact 22 and the elastomeric elements 50, 76 assume the positions illustrated in FIG. 3.

Figure 4:
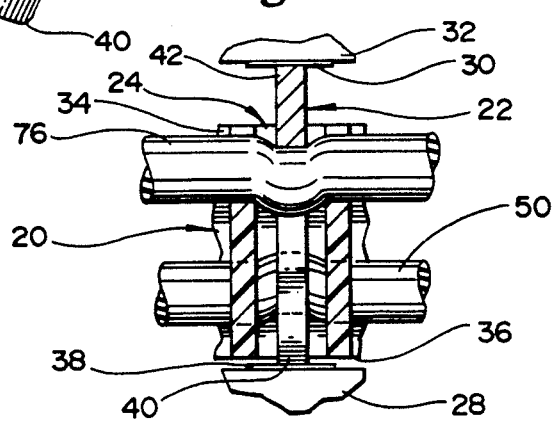
FIG. 4 is a view similar to FIG. 3 showing the contact engaged by an integrated circuit device lead.

FIG. 4 illustrates the response of the assembly when the lead 30 of an integrated circuit 32 is brought into engagement with the protrusion 42 of the contact 22. As can be seen, the elastomeric element 76 received in the trough 56 formed in the first surface 34 of the housing 20 is deformed downwardly as it undergoes compression and tensile extension.

With the nub 40 of the contact 22 in engagement with the terminal 38 on the printed circuit board 28, there will be a deformation of the elastomeric element 50 received in the trough 58 formed in the second surface 36 of the housing 20. As seen in FIG. 4, this deformation will have an apparent upward movement.

In the embodiment illustrated in FIGS. 1-5, the printed circuit board 28 might, initially, be spaced from the second surface 36 of the housing 20. As the lead 30 of the integrated circuit device 32 is brought into engagement with the protrusion 42 of the contact 22 to urge the protrusion 42 downwardly, the lower extremity of the contact 22 (that is, the nub 40) will come into engagement with the terminal 38 of the printed circuit board 28. As continued downward movement of the protrusion 42 of the contact 22 occurs, co-related upward movement of the nub 40 will result. This movement of the contact 22 will function to accomplish wiping and protection of the integrated circuit lead 30.

Figure 10:
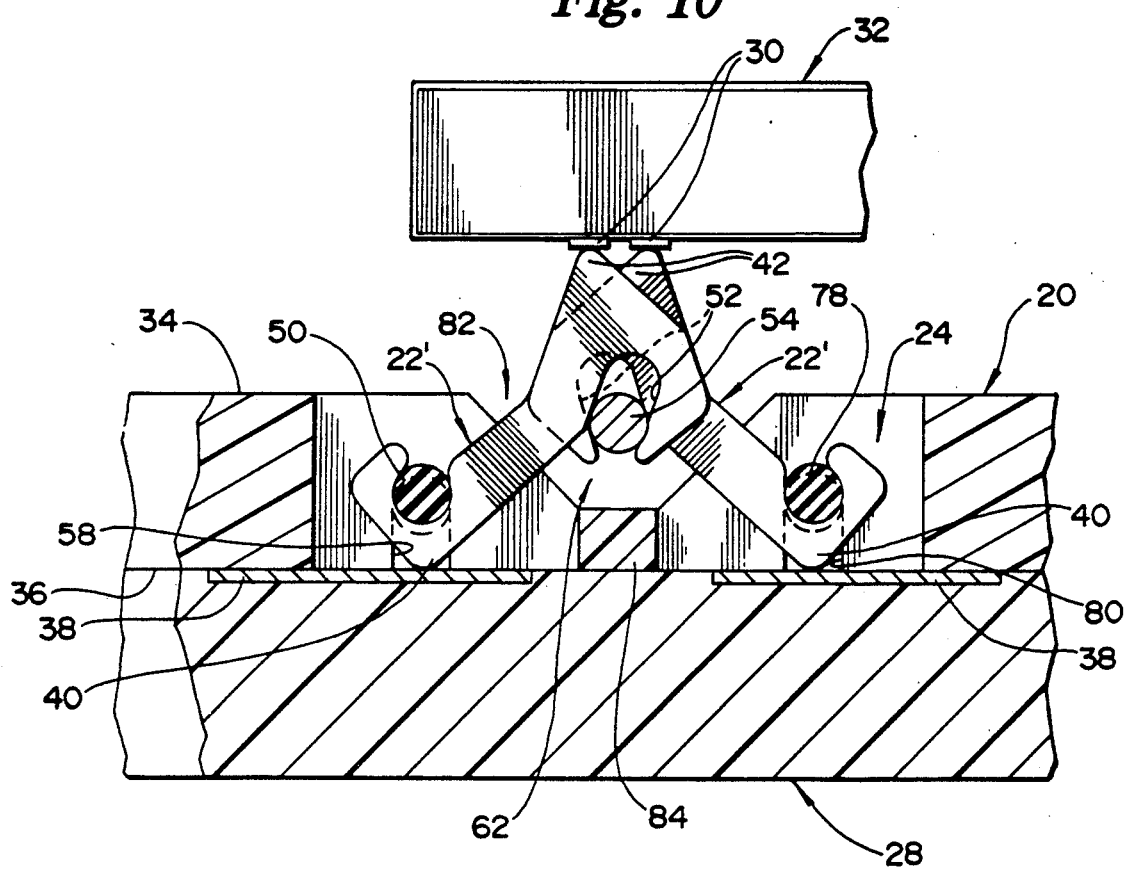
FIG. 10 is a fragmentary side elevational view with some parts cut away showing another embodiment of the invention.
Figure 11:
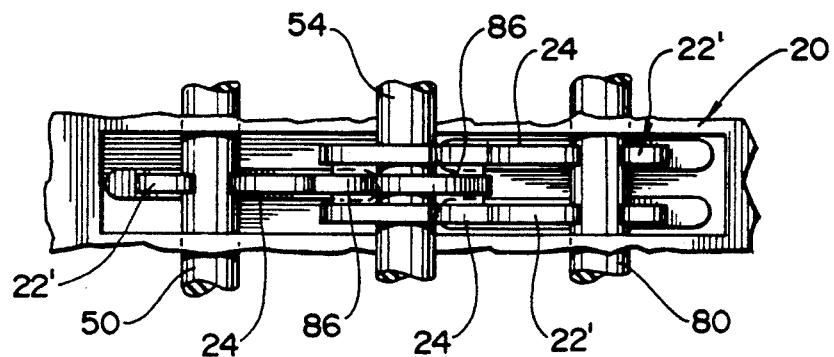
FIG. 11 is a fragmentary top view of the embodiment of FIG. 10.

FIGS. 10 and 11 illustrate an embodiment akin, in some respects, to the embodiment of FIGS. 6 and 7. In this embodiment, a rigid element is employed and is received in the elongated channel 52 of each of a plurality of contacts 22'. In this embodiment, however, contacts 22' in adjacent slots 24 are staggered. That is, while one contact 22' extends to the left as seen in FIG. 10, the next contact 22' extends to the right.

It will be understood, and it is illustrated in FIGS. 10 and 11, that an additional elastomeric element 78 is provided, since hook portions 44 of the various contacts 22' in the array extend on two sides of the central, rigid element 54. In order to accommodate the additional elastomeric element 78, a second trough 80 is formed in the second surface 36 of the housing 20. The trough 80 would be spaced laterally from an intended location of the rigid element 54 substantially the same distance that the initial elastomeric element 50 is spaced in an opposite direction. As a result, the contact array will appear symmetrical. This arrangement is best seen in FIG. 10.

In the embodiment of FIGS. 10 and 11, a trough need not be provided in the first surface 34 of the housing 20 to receive he rigid element 54. Because of the oppositely coacting contacts, the rigid element 54 can be received in various elongated channels 52 in the contacts 22', and the reciprocal cooperation of the contact channels 52 will result in a jaw effect whereby the rigid element 54 is held in the channels 52.

Since a trough need not be provided for receipt of the rigid element, material need not be expended in forming the housing 20 at the location where the rigid element 54 is disposed. As seen in FIG. 10 then, a generally V-shaped recess 82 can be formed in the housing 20 with a central wall 4 extending upwardly from the second surface 36 of the housing 20 to separate left and right slots 24 . Material from which the housing 20 is formed can, thereby, be conserved.

As seen in FIG. 11, the slots 24, typically, have an axial dimension greater than that of the respective contacts 22'. Consequently, there can be some play with the contacts 22' not being maintained in continuously defined planes. Since the contacts 22' are conductive in nature, insulative washers 86 can be disposed between adjacent contacts 22' along the rigid element 54. The axial dimension of the washers 86 can be such that play among the contacts 22' can be minimized.

FIG. 10 illustrates an integrated circuit device 32 with its leads 30 being brought into engagement with the protrusions 42 of the various contacts 22'. FIG. 10 illustrates those leads 30 as being spaced laterally in order to conform to the positions of the protrusion 42 of the contacts 22'. In fact, it will be understood that the slots 24 and respective contacts 22' received therein can be constructed in a manner so as to accommodate integrated circuits 32 structured in any particular fashion.

Regardless of the embodiment of the invention, the housing 20 is substantially the same, varying only based upon the intended location of the contacts 22'. The housing 20 can be fabricated by forming the slots 24 with either laser machining (typically, for prototyping and small production quantities) or injection molding of the overall housing 20 with slots 24 formed therein (typically, for economic production quantities). Contacts 22, 22' can be suspended in a manner previously discussed. As one will perceive, contacts 22, 22' are individually replaceable.

The contacts 22, 22' are designed to provide very short electrical paths. Typically, the overall length of a contact would not exceed 0.14 inches. In contacts in accordance with the present invention, such a length translates into a 2.0 nanohenries inductance between surfaces. As a result, very high digital signals (typically greater than 100 megahertz) can be transmitted without any significant loss of fidelity. Since the areas of the contacts 22, 22' which actually engage integrated circuit device leads 30 and printed circuit board terminals 38 is minimal, the amount of cross-talk between signal lines will also be minimal. This will provide for higher isolation of transmitted analog signals.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined in the language in which the appended claims are expressed.

What is claimed is:

1. Apparatus for electrically interconnecting a lead of an integrated circuit device to a terminal spaced at a distance from the lead of the device, comprising:

(a) a housing interposed between the integrated circuit lead and the spaced terminal and having at least one contact receiving slot formed therein, said slot extending substantially parallel to an axis extending between a corresponding integrated circuit lead and spaced terminal, said housing further having oppositely facing first and second surfaces, said first surface having a trough formed therein proximate the integrated circuit lead, and said second surface having a trough formed therein proximate the spaced terminal;

(b) a rigid first element received in said trough formed in said first surface and extending across said slot;

(c) an elastomeric second element received in said trough formed in said second surface, said elastomeric second element having a measure of compressibility and tensile extendability; and (d) a generally planar contact received within said slot, said contact having a protrusion extending outward from said first surface for engagement by an integrated circuit lead, a nub normally extending outward from said housing toward said second surface to engage the spaced terminal, and a hook portion, proximate said nub, encircling said elastomeric second element to hold said contact to said elastomeric second element, said contact having formed therein an elongated channel receiving said rigid first element therein for relative movement of said rigid first element along said channel as said protrusion is engaged by an integrated circuit lead;

(e) wherein, as said rigid first element moves relatively along said channel, said protrusion moves across the integrated circuit lead, and said nub moves across the spaced terminal.

2. Apparatus in accordance with claim 1 wherein said trough formed in said first surface is substantially symmetrical with respect to a plane normal to said first surface, and wherein an axis of elongation of said channel is at an angle relative to such a plane.

3. Apparatus in accordance with claim 2 wherein, as said rigid first element moves relatively along and into said channel, said angle increases.

4. Apparatus for providing an electrical interface between the leads of an integrated circuit device and corresponding terminals on a printed circuit board spaced at a distance from the leads of the integrated circuit device, comprising:

(a) a housing positioned intermediate the integrated circuit device leads and the printed circuit board and having a plurality of contact receiving slots formed therein, each of said slots extending substantially parallel to an axis along which the integrated circuit device and the printed circuit board are aligned, said housing further having oppositely facing first and second surfaces, said first surface having at least one trough formed therein proximate the integrated circuit leads and extending across a plurality of corresponding slots, and said second surface having at least one trough formed therein proximate a corresponding plurality of spaced terminals on the printed circuit board and extending across the plurality of slots across which said trough formed in said second surface extends;

(b) a rigid first element received within each of said troughs formed in said first surface, each of said rigid first elements extending across said slots across which said trough in which said rigid first element is received extends;

(c) an elastomeric second element received in each of said troughs formed in said second surface and extending across said slots in which the trough in which the elastomeric second element is received extends, said elastomeric elements having a measure of compressibility and tensile extendability; and (d) a generally planar contact received within each of said slots with said first and second elements extending thereacross, each of said contacts having a protrusion extending outwardly from said first surface for engagement by an integrated circuit lead, a nub normally extending outwardly from said housing toward said second surface to engage the printed circuit board terminals, and a hook portion proximate said nub and encircling an elastomeric second element received in said trough extending across said slots, one of which slots receives said contact, said hook portion functioning to hold said contact to said elastomeric second element, each of said contacts having formed therein an elongated channel receiving a corresponding rigid first element therein for relative movement of said rigid first element along said channel as said protrusion of said contact is engaged by an integrated circuit lead;

(e) wherein, as said rigid first element moves relatively along said channel in each of said contacts, said protrusions of said contacts move across corresponding integrated circuit leads, and said nubs of said contacts move across corresponding terminals of the printed circuit board.

5. Apparatus in accordance with claim 4 further including an additional elastomeric second element received in an additional trough formed within said second surface of said housing, said additional elastomeric second element being disposed symmetrically, along with said elastomeric second element, with respect to said rigid first element.

6. Apparatus in accordance with claim 5 wherein hook portions of contacts disposed within adjacent slots encircle, alternately, said elastomeric second element and said additional elastomeric second element.

* * * * *